(12) United States Patent
Chen

(10) Patent No.: US 6,914,494 B1
(45) Date of Patent: Jul. 5, 2005

(54) VERY LOW CURRENT OSCILLATOR WITH VARIABLE DUTY CYCLE

(75) Inventor: Sean S. Chen, Sunnyvale, CA (US)

(73) Assignee: National Semiconductor Corporation, Santa Clara, CA (US)

(*) Notice: Subject to any disclaimer, the term of this patent is extended or adjusted under 35 U.S.C. 154(b) by 69 days.

(21) Appl. No.: 10/649,085

(22) Filed: Aug. 26, 2003

(51) Int. Cl.[7] .................................................. H03L 7/00
(52) U.S. Cl. ...................... 331/111; 143/185; 143/173
(58) Field of Search .............................. 331/111, 143, 331/145, 149, 153, 173, 185; 323/243

(56) References Cited

U.S. PATENT DOCUMENTS 5,384,554 A * 1/1995 Abernethy .................. 331/153
6,356,161 B1 * 3/2002 Nolan et al. ................ 331/176
6,456,170 B1 * 9/2002 Segawa et al. ............. 331/143

* cited by examiner

*Primary Examiner*—Robert Pascal
*Assistant Examiner*—Joseph Chang

(57) ABSTRACT

A low current oscillator circuit comprising a comparator for driving an output signal. A first capacitor chain is coupled to the comparator. The first capacitor chain is configured for setting a first input voltage of the comparator. A second capacitor chain is also coupled to the comparator. The second capacitor chain is configured for setting a second input voltage of the comparator, wherein the first capacitor chain and the second capacitor chain determine a first voltage level and a second voltage level of oscillation of the comparator. The first capacitor chain and the second capacitor chain are free of DC current flow.

17 Claims, 5 Drawing Sheets

VERY LOW CURRENT OSCILLATOR WITH VARIABLE DUTY CYCLE

TECHNICAL FIELD

The present invention relates to the field of low-power integrated circuits. More particularly, the present invention relates to low current oscillator circuits.

BACKGROUND ART

Minimizing power consumption is critical in extending operating time in portable or battery power devices. The lower the power consumption of the circuit elements of, for example, a handheld cell phone, the longer the handheld cell phone can provide its functionality to the user. Accordingly, circuit elements of a given device are designed for minimal power consumption.

Low power consumption constraints generally apply to all elements of an integrated circuit device, such as, for example, processors, output drivers, displays, etc. The circuit elements are designed to interact and function with each other, and must adequately perform their required function while remaining within the desired power consumption constraints. Oscillator circuits comprise one of the most fundamental circuit elements of electronic devices.

Oscillators are used to produce a wide variety of periodic signals (e.g., clock signals, etc.). Many of the components of an integrated circuit device rely on clock signals generated by oscillator circuits to produce their functionality. For example, modern analog to digital converters (ADCs) function by using low jitter external clock source. ADCs are specified to operate with a clock signal having a duty cycle that varies across a specified range.

Similarly, most signal sampling mechanisms common to data communication applications rely on high-quality clock signals to sample incoming data. It is becoming increasingly common for such sampling mechanisms to function on both the rising edge and the falling edge of a clock signal, thereby making duty cycle control an important factor. As is well known, a clock signal's duty cycle refers to a ratio of one clock phase width to the entire clock period.

A problem exists, however, with prior art oscillator circuits. As described above, high-quality clock signals are critical to functioning of many different functional blocks of an integrated circuit device. To produce such high-quality clock signals, and to provide a precise adjustable duty cycle, prior art oscillator circuits include a large number of transistors, current sources, and other circuit elements. These elements tend to increase power consumption, thereby reducing battery life of a handheld device. Additionally, a large number of circuit elements increase the amount of silicon area dedicated to the oscillator circuit, thereby increasing the cost of the overall device.

Prior art FIG. 1 shows a diagram of a typical prior art oscillator circuit 100. The prior art oscillator circuit 100 includes two amplifiers 151–152. The oscillation is driven primarily from the action of the amplifiers 151–152, which function as comparators. The output of the comparators 151–152 are respectively coupled to the NAND gates 121–122 as shown. The NAND gates 121–122 are coupled in a feedback loop as depicted, which oscillates between a high-value and a low value. The output of the oscillator circuit 100 is derived from the output of the inverter 123.

The oscillator circuit 100 includes the current sources 101–105 as shown. The high voltage level and the low voltage level between which the oscillator circuit 100 oscillates is set by the voltages $V_1$ and $V_2$ as derived from the current from the current source 101 flowing through a resistor 111 and a resistor 112. The voltages $V_1$ and $V_2$ are coupled to the positive input of comparator 151 and the negative input of comparator 152 as shown. In this manner, the current source 101 (e.g., $I_1$) creates the voltages $V_1$ and $V_2$.

The current source 102 and the current source 103 bias the comparators 151–152 as shown. The current source 104 and the current source 105 are used to charge and discharge the capacitor $C_1$, and thereby produce the output signal at node 130. As shown in prior art FIG. 1, the current source 104 charges the capacitor $C_1$ to the voltage $V_2$ and the current source 105 discharges the capacitor $C_1$ to the voltage $V_1$.

One problem with prior art oscillator circuit 100 is that it consumes too much power. As shown in prior art FIG. 1, the oscillator circuit 100 requires five current sources 101–105 in order to function. Each of these current sources represents a power consuming element. Another problem is the fact that the prior art oscillator circuit 100 requires two comparators 151–152, which both consume power.

Yet another problem with the prior art oscillator circuit 100 is the fact that it requires a constant current flow, and thus a constant power drain, from the current source 101 across the resistor 111 and the resistor 112. These current flows are required in order to create voltages $V_1$ and $V_2$.

Thus, what is required is a solution for implementing a very low power consumption oscillator circuit for an integrated circuit device. The required solution should provide an adjustable duty cycle that can be set in accordance with the needs of a given application. Additionally, the required solution should require fewer circuit elements in comparison to prior art oscillator circuit implementations.

SUMMARY OF THE INVENTION

Embodiments of the present invention provide a solution for implementing a very low power consumption oscillator circuit for an integrated circuit device. Embodiments of the present invention provide an adjustable duty cycle that can be set in accordance with the needs of a given application. Additionally, the embodiments of the present invention require fewer circuit elements in comparison to prior art oscillator circuit implementations.

In one embodiment, the present invention is implemented as a low current oscillator circuit comprising a comparator for driving an output signal. A first capacitor chain is coupled to the comparator. The first capacitor chain is configured for setting a first input voltage of the comparator. A second capacitor chain is also coupled to the comparator. The second capacitor chain is configured for setting a second input voltage of the comparator, wherein the first capacitor chain and the second capacitor chain determine a first voltage level and a second voltage level of oscillation of the comparator (e.g., the high level and the low level of the voltage swings of the output of the comparator). The first capacitor chain and the second capacitor chain are both free of DC current flow, thereby providing for a very low power consumption of the oscillator circuit. In one embodiment, the ratios between the capacitors of the capacitor chains determine the first and second voltage levels of oscillation. In one embodiment, a switch circuit is coupled to the comparator to set the duty cycle of the oscillation of the comparator.

BRIEF DESCRIPTION OF THE DRAWINGS

The present invention is illustrated by way of example and not by way of limitation, in the figures of the accompanying drawings and in which like reference numerals refer to similar elements.

Prior art

DETAILED DESCRIPTION OF THE INVENTION

Reference will now be made in detail to the embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be understood by one of ordinary skill in the art that the present invention may be practiced without these specific details. In other instances, well known methods, procedures, components, and circuits have not been described in detail as not to unnecessarily obscure aspects of the present invention.

Embodiments of the present invention provide a solution for implementing a very low power consumption oscillator circuit for an integrated circuit device. Embodiments of the present invention provide an adjustable duty cycle that can be set in accordance with the needs of a given application. Additionally, the embodiments of the present invention require fewer circuit elements in comparison to prior art oscillator circuit implementations. Embodiments of the present invention and their benefits are further described below.

Figure 2:
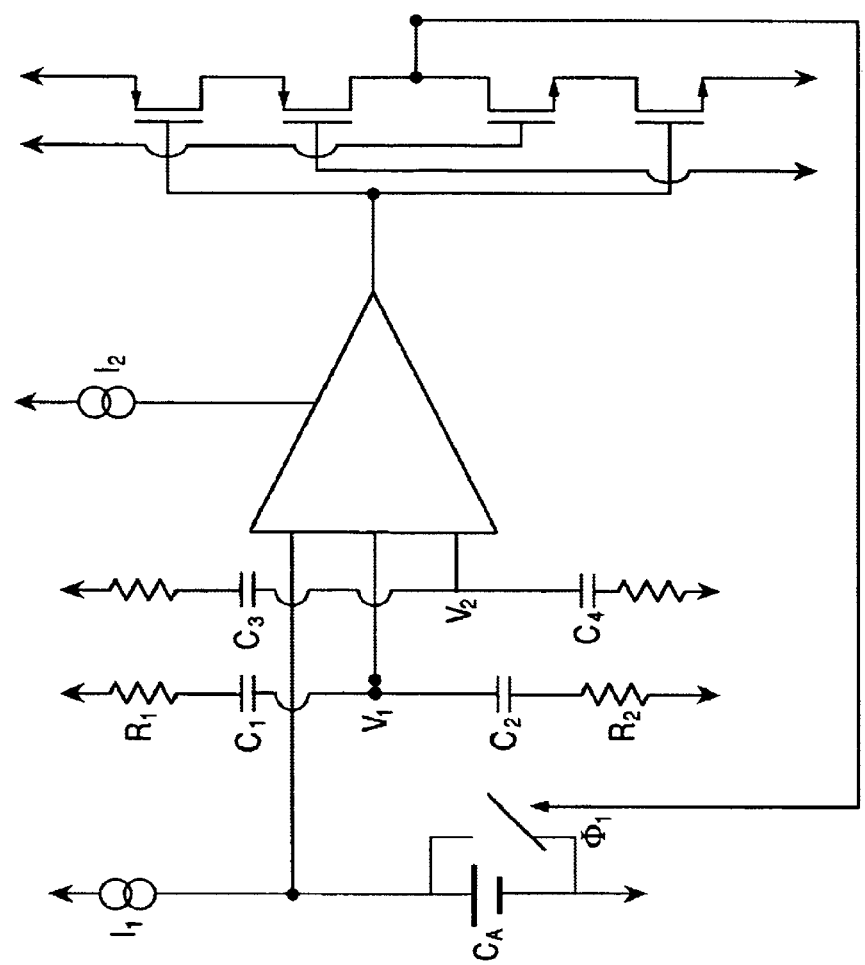
FIG. 2 shows a diagram of a very low current oscillator circuit in accordance with one embodiment of the present invention.

FIG. 2 shows a diagram of a very low current oscillator circuit 200 in accordance with one embodiment of the present invention. As illustrated in FIG. 2, the oscillator circuit 200 includes a single comparator 251. The oscillator circuit 200 also includes a first current source 201 and a second current source 202.

The oscillator circuit 200 embodiment is configured as an ultra low current oscillator circuit. The comparator 251 is configured for driving an output signal, which is taken at node 230. The oscillator circuit 200 includes two capacitor chains for setting the voltage levels of the oscillation. The resistors $R_1$ and $R_2$ and the capacitors $C_1$ and $C_2$ comprise the first capacitor chain. Similarly, the resistors $R_3$ and $R_4$ and the capacitors $C_3$ and $C_4$ comprise the second capacitor chain, as shown.

Figure 1:
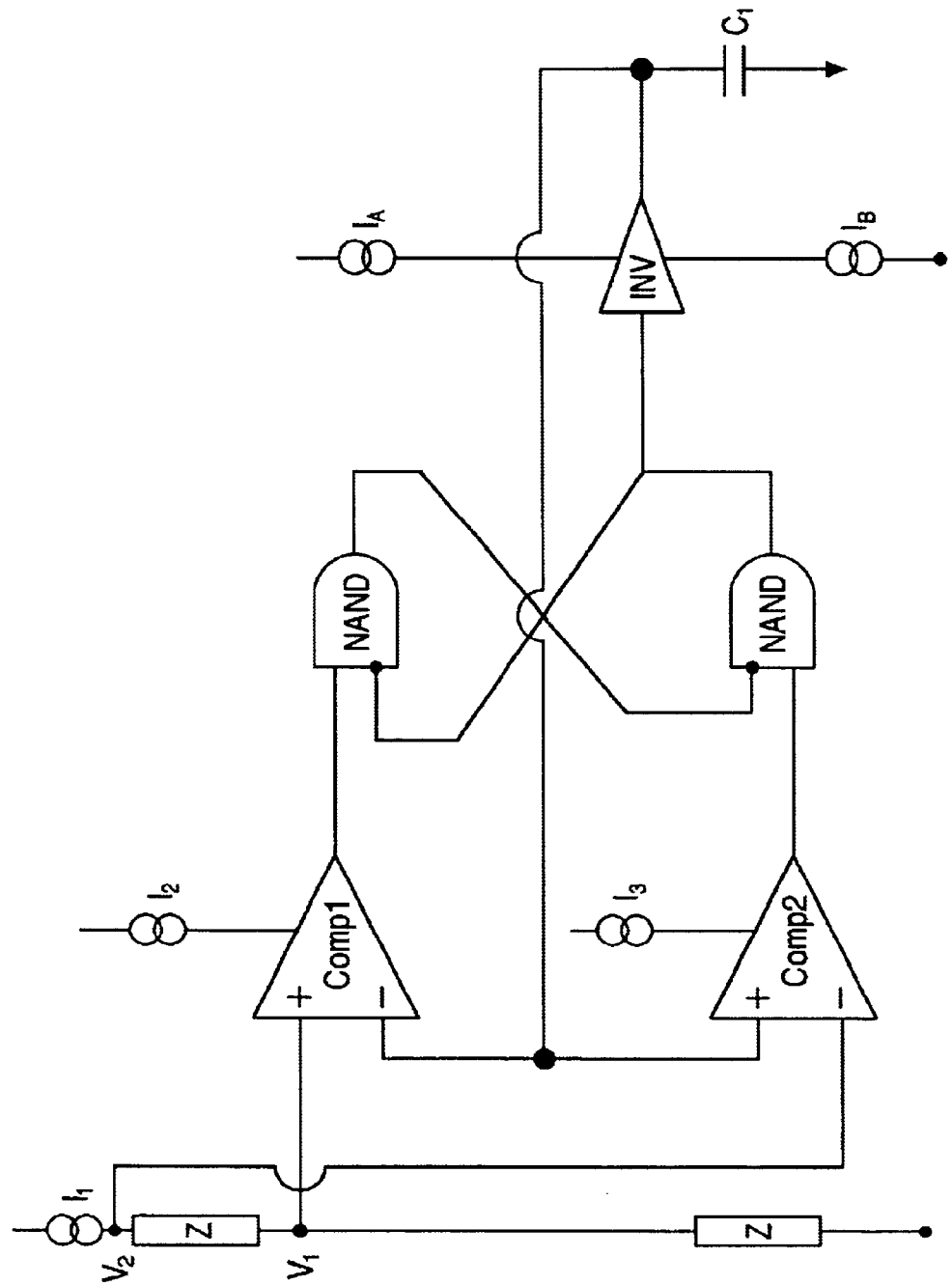
FIG. 1 shows a diagram of a typical prior art oscillator circuit.

In the present embodiment, the voltage levels of oscillation are set by the two capacitor chains. As shown in FIG. 1, the comparator 251 has three inputs 252, 253 and 254. Two of these inputs (e.g., 253 and 254) are used to set the levels of the oscillation (e.g., the low voltage level of the oscillation and the high voltage level of the oscillation). In the present embodiment, the input 253 is coupled to $V_1$ of the first capacitor chain and the input 254 is coupled to $V_2$ of the second capacitor chain. The $V_1$ and $V_2$ voltages are created by the ratios of the capacitors of the respective chains. For example, in the oscillator circuit 200 embodiment as shown, the $V_1$ voltage is determined by the expression $V_1 = C_1/(C_1+C_2)$ and the $V_2$ voltage is determined by the expression $V_2 = C_3/(C_3+C_4)$.

Thus, in contrast to prior art oscillator circuits where a current from a current source must flow across resistors in order to make the input voltages, the $V_1$ and $V_2$ voltages are created by the first and second capacitor chains that are completely free of DC current flow. In this manner, the oscillator circuit 200 embodiment of the present invention completely eliminates a current flow requirement for setting input voltages for the comparator 251. This aspect greatly reduces the current flow within the oscillator circuit 200 embodiment, thereby greatly reducing the power consumption.

Referring still to FIG. 2, the oscillator circuit 200 includes a switch circuit comprising a capacitor $C_A$ and a switch φ as shown. The switch circuit functions by initiating the oscillation in the comparator 251. A current source 201 is connected to the capacitor $C_A$ and the switch φ. In the present embodiment, the switch circuit functions by setting the duty cycle of the oscillator circuit 200. The node 235 between the current source 201 and a switch circuit is coupled to the input 252 of the comparator 251.

The current source 201 (e.g., $I_1$) functions by charging the capacitor $C_A$ to the voltage $V_2$ (e.g., the high voltage level). The switch φ functions by discharging the capacitor $C_A$ to the voltage $V_1$ (e.g., the low voltage level). The configuration of the switch φ and the capacitor $C_A$ determines the duty cycle of the output signal (e.g., the signal from output node 230). This duty cycle can be adjusted by adjusting switch φ and the capacitor $C_A$ (e.g., in accordance with the requirements of the overall device or system application). A DC current path to ground for the current source 201 exists only when the switch φ is closed.

In the oscillator circuit 200 embodiment, the output of the comparator 251 is coupled to a feedback circuit comprising the transistors 211–214 as shown. The feedback circuit functions by driving the switching action of the switch φ. An output of the oscillator circuit 200 is taken from the node 230.

Depending upon the overall system in which the oscillator 200 is included, the output taken from node 230 can be shaped by additional external circuit elements (not shown). For example, external filtering elements can be coupled to the output in order to smooth the output into, for example, a sine wave. External filtering elements can be coupled to the output to shape the output into a sawtooth wave, or the like. In this manner, the oscillator 200 can provide a wide variety of different periodic signals used in electronic devices.

It should be noted that the oscillator circuit 200 embodiment of the present invention includes only one comparator (e.g., comparator 251), in comparison to prior art oscillator circuit implementations which included two or more comparators. The single comparator 251 only requires a single current source 202 (e.g., $I_2$), as supposed to the two or more current sources required in prior art oscillator circuit implementations. This aspect further reduces power consumption of the oscillator circuit 200 in comparison to the prior art.

It should also be noted that the oscillator circuit 200 embodiment of the present invention has a low component count in comparison to prior art oscillator circuit implementations. For example, by reducing the number of included comparators (e.g., to one) and by reducing the number of current sources, the component count, and thus the silicon area required to manufacture the oscillator circuit 200, is reduced. The reduced silicon area results in a corresponding reduction in cost.

These aspects enable the oscillator circuit 200 embodiment of the present invention to implement a very low power consumption oscillator circuit for an integrated circuit device. The low power consumption benefits are provided while enabling duty cycle adjustment and oscillation voltage level adjustment. These features are provided while also reducing manufacturing costs in comparison to prior art.

Figure 3:
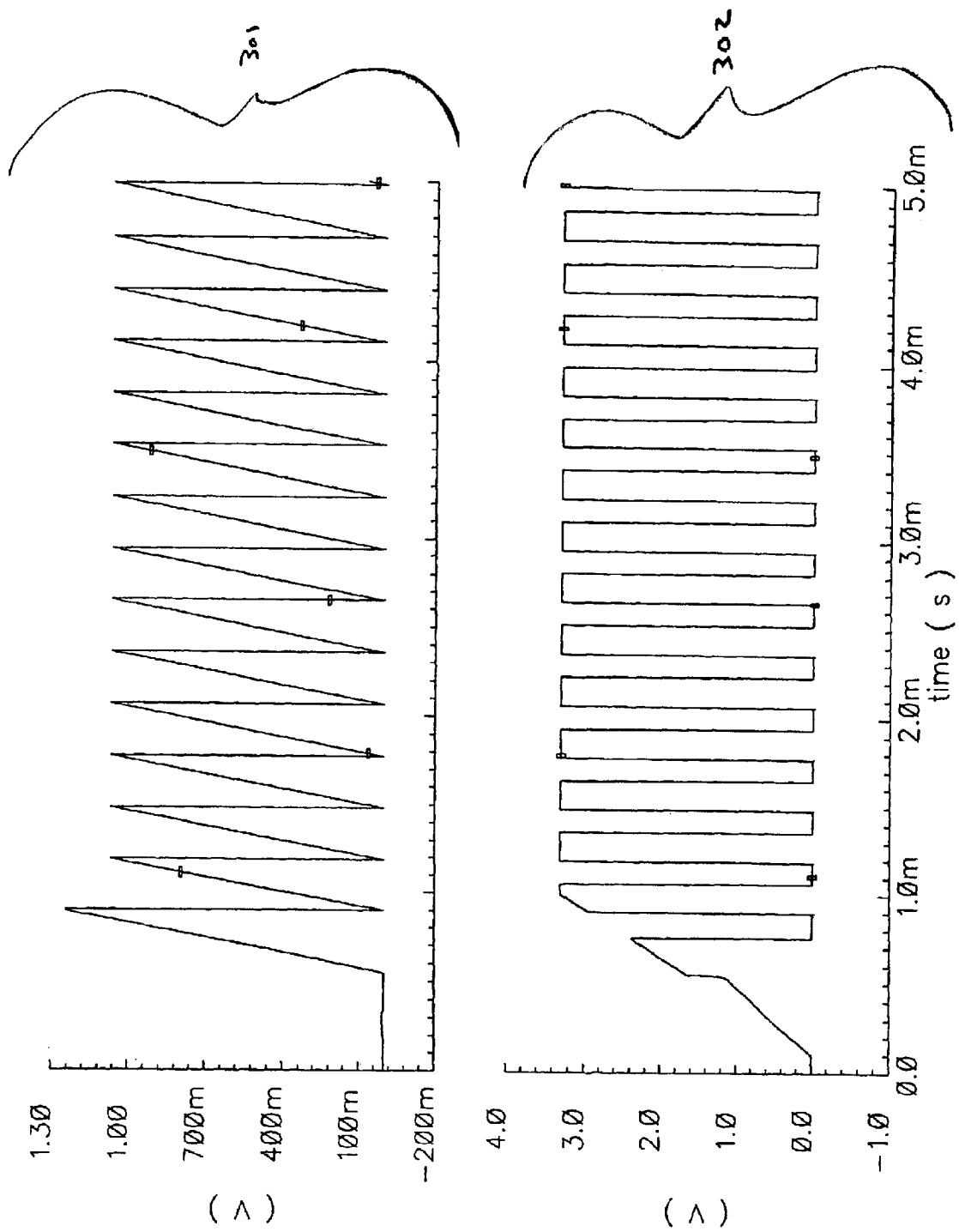
FIG. 3 shows a first graph and a second graph depicting signals of the oscillator circuit in accordance with one embodiment of the present invention.

FIG. 3 shows a graph 301 and a graph 302 depicting signals of the oscillator circuit 200 in accordance with one embodiment of the present invention. The horizontal axis of both the graphs 301 and 302 represents time. The vertical axis of the graphs 301 and 302 represents voltage, in the scale shown. The graph 301 shows the voltage at the node 235 of the oscillator circuit 200, as the capacitor $C_A$ charges over time from the current source 201 and is discharged by the switch φ. The graph 302 shows the square wave output at node 230. Both graphs 301–302 are shown beginning from an initial power on.

Figure 4:
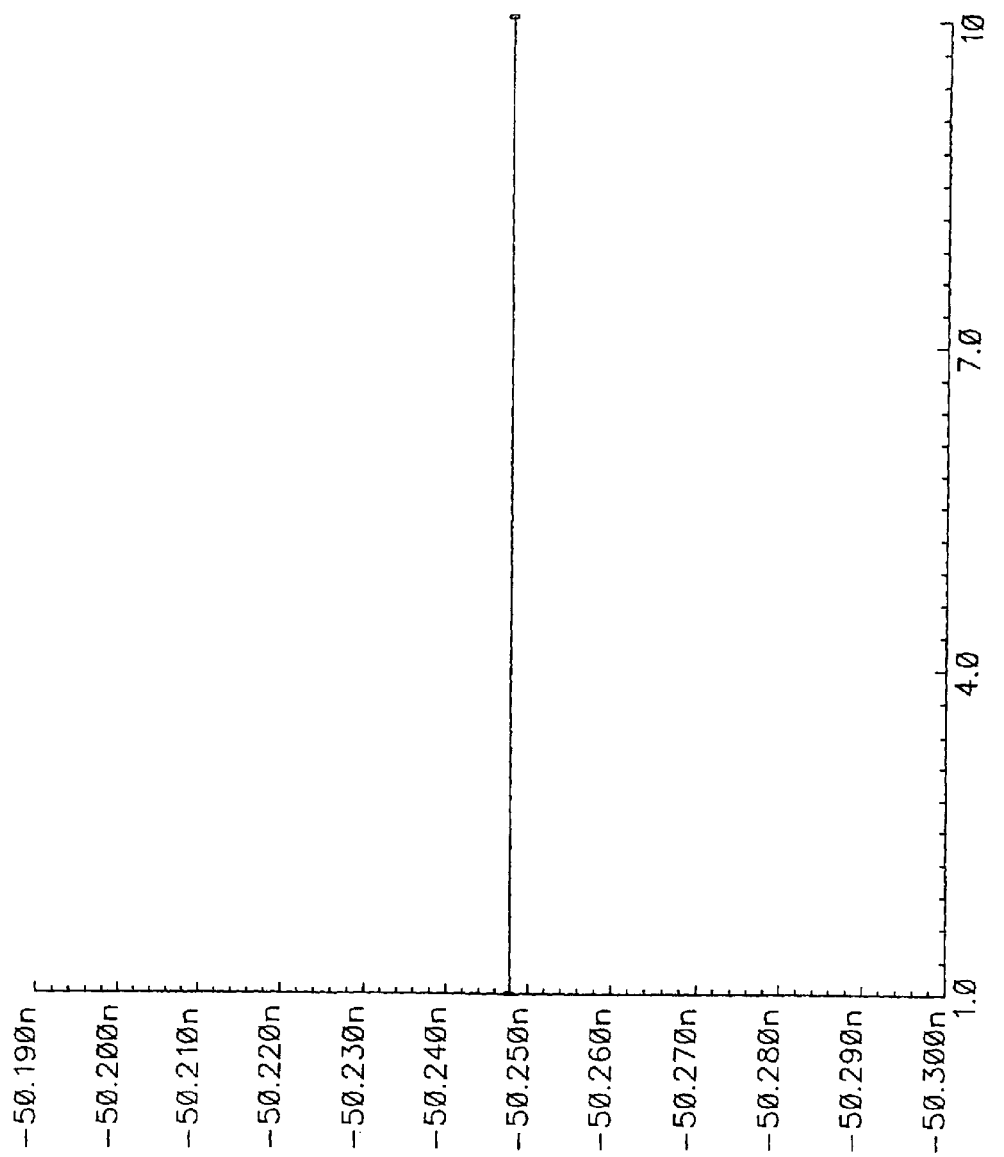
FIG. 4 shows a graph of the overall power consumption of the oscillator circuit in accordance with one embodiment of the present invention.

FIG. 4 shows a graph of the overall power consumption of the oscillator circuit 200 in accordance with one embodiment of the present invention. As shown in FIG. 4, during normal operation, the oscillator circuit 200 draws a constant, very low amount of current. In this embodiment, the oscillator circuit 200 draws approximately 50.248 nano-Amps.

Figure 5:
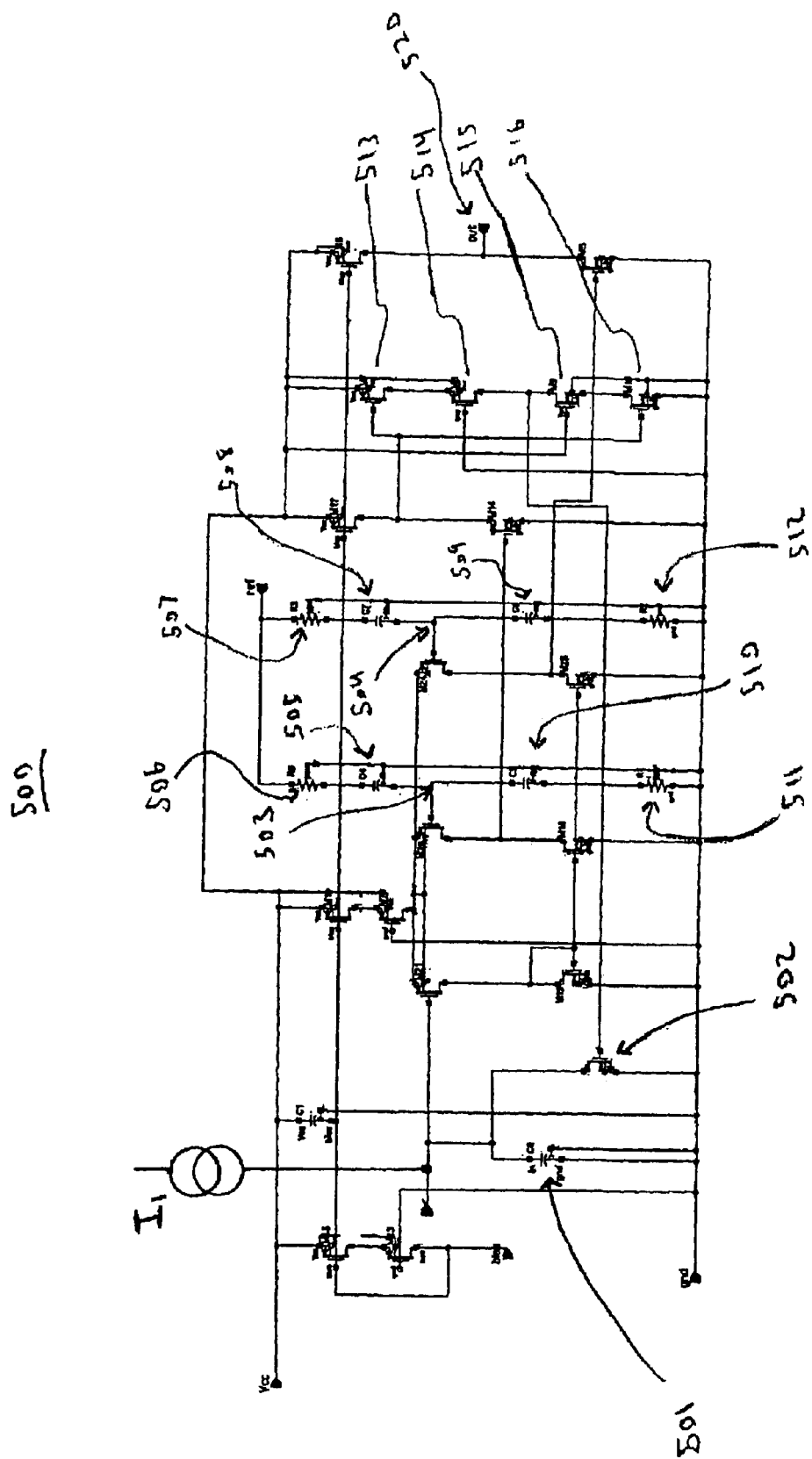
FIG. 5 shows a schematic diagram of an oscillator circuit in accordance with one embodiment of the present invention.

FIG. 5 shows a schematic diagram 500 of an oscillator circuit in accordance with one embodiment of the present invention. The diagram 500 of FIG. 5 shows a more detailed illustration of oscillator circuit 200 of FIG. 2. The oscillator circuit of the diagram 500 functions in substantially the same manner as the oscillator circuit 200 described in the discussion FIG. 2 above.

The correspondence between the schematic diagram 500 and the oscillator circuit 200 of FIG. 2 is now described. In the diagram 500 illustration, the capacitor 501 corresponds to capacitor $C_A$. The transistors 502 correspond to the switch φ. The node 503 corresponds to the voltage level $V_1$ and the node 504 corresponds to the voltage level $V_2$. The capacitor 505 corresponds to the capacitor $C_1$. The resistor 506 and the resistor 507 correspond to the resistors $R_1$ and $R_3$. The capacitor 508 and capacitor 509 correspond to capacitors $C_3$ and $C_4$. Capacitor 510 corresponds to the capacitor $C_2$. The resistors 511 and 512 correspond to the resistors $R_2$ and $R_4$. The transistors 513–516 correspond to the transistors 211–214. The output 520 corresponds to the output node 230.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the claims appended hereto and their equivalents.

What is claimed is:

1. A low current oscillator circuit, comprising:
    a comparator for driving an output signal;
    a first capacitor chain coupled to the comparator and for setting a first input voltage of the comparator; and
    a second capacitor chain coupled to the comparator and for setting a second input voltage of the comparator, wherein the first capacitor chain and the second capacitor chain determine a first voltage level and a second voltage level of oscillation of the comparator free of DC current flow.

2. The low current oscillator circuit of claim 1, further comprising:
    a switch circuit coupled to the comparator and for initiating an oscillation in the comparator.

3. The low current oscillator circuit of claim 2, further comprising:
    a feedback circuit coupled to an output of the comparator, the feedback circuit also coupled to the switch circuit for driving the switch circuit.

4. The low current oscillator circuit of claim 2, further comprising:
    a capacitor included in the switch circuit;
    a current source coupled to capacitor and for charging the capacitor to the high voltage; and
    a switch coupled to the capacitor for discharging the capacitor to the low voltage.

5. The low current oscillator circuit of claim 1, further comprising:
    a first capacitor and a second capacitor included in the first capacitor chain; and
    a third capacitor and a fourth capacitor included in the second capacitor chain, wherein a node between the first capacitor and the second capacitor determines the first voltage level of oscillation and a node between the third capacitor and the fourth capacitor determines the second voltage level of oscillation.

6. An integrated circuit system including a low current oscillator circuit, comprising:
    a comparator for driving an output signal;
    a first capacitor chain coupled to the comparator and for setting a first input voltage of the comparator;
    a second capacitor chain coupled to the comparator and for setting a second input voltage of the comparator, wherein the first capacitor chain and the second capacitor chain determine a first voltage level and a second voltage level of oscillation of the comparator free of DC current flow; and
    an output signal line coupled to an output of the comparator for providing an oscillation signal to external circuit elements of the integrated circuit system.

7. The integrated circuit system of claim 6, further comprising:
    a switch circuit coupled to the comparator and for initiating an oscillation in the comparator.

8. The integrated circuit system of claim 7, further comprising:
    a feedback circuit coupled to an output of the comparator, the feedback circuit also coupled to the switch circuit for driving the switch circuit.

9. The integrated circuit system of claim 7, further comprising:
    a capacitor included in the switch circuit;
    a current source coupled to capacitor and for charging the capacitor to the high voltage; and a switch coupled to the capacitor for discharging the capacitor to the low voltage.

10. The integrated circuit system of claim 6, further comprising:
   a first capacitor and a second capacitor included in the first capacitor chain; and
   a third capacitor and a fourth capacitor included in the second capacitor chain, wherein a node between the first capacitor and the second capacitor determines the first voltage level of oscillation and a node between the third capacitor and the fourth capacitor determines the second voltage level of oscillation.

11. A low current oscillator circuit, comprising:
   means for driving an output signal using a comparator;
   means for setting a first input voltage of the comparator using a first capacitor chain coupled to the comparator; and
   means for setting a second input voltage of the comparator using a second capacitor chain coupled to the comparator, wherein the first capacitor chain and the second capacitor chain determine a first voltage level and a second voltage level of oscillation of the comparator free of DC current flow.

12. The low current oscillator circuit of claim 11, further comprising:
   means for initiating an oscillation in the comparator using a switch circuit coupled to the comparator.

13. The low current oscillator circuit of claim 12, further comprising:
   means for driving the switch circuit using a feedback circuit coupled to an output of the comparator, the feedback circuit also coupled to the switch circuit.

14. The low current oscillator circuit of claim 12, further comprising:
   a capacitor included in the switch circuit;
   means for charging the capacitor to the high voltage using a current source coupled to capacitor; and
   means for discharging the capacitor to the low voltage using a switch coupled to the capacitor.

15. The low current oscillator circuit of claim 11, further comprising:
   a first capacitor and a second capacitor included in the first capacitor chain; and
   a third capacitor and a fourth capacitor included in the second capacitor chain, wherein a node between the first capacitor and the second capacitor determines the first voltage level of oscillation and a node between the third capacitor and the fourth capacitor determines the second voltage level of oscillation.

16. The low current oscillator circuit of claim 15, wherein a first ratio of the first capacitor and the second capacitor determines the first voltage level and a second ratio of the third capacitor and the fourth capacitor determines the second voltage level.

17. The low current oscillator of claim 11, further comprising:
   means for determining a duty cycle of an oscillation in the comparator using a switch circuit coupled to the comparator.

* * * * *